(12) United States Patent
Machida et al.

(10) Patent No.: US 6,490,697 B1
(45) Date of Patent: Dec. 3, 2002

(54) DIAGNOSING APPARATUS AND METHOD FOR RAM

(75) Inventors: Kenichi Machida, Atsugi (JP); Tatsuji Ohkubo, Atsugi (JP); Masahiro Iriyama, Yokohama (JP); Kenichi Goto, Zama (JP)

(73) Assignees: Unisia Jecs Corporation, Kanagawa-Ken (JP); Nissan Motor Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/384,403

(22) Filed: Aug. 27, 1999

(30) Foreign Application Priority Data

Aug. 27, 1998 (JP) .......................................... 10-242221
Nov. 2, 1998 (JP) .......................................... 10-312008

(51) Int. Cl.$^7$ .............................................. G06F 11/26
(52) U.S. Cl. ............................................ 714/42; 714/723
(58) Field of Search ................................. 714/42, 5, 45, 714/723, 30, 53, 54; 701/31, 35

(56) References Cited

FOREIGN PATENT DOCUMENTS

| JP | 63282852 A | * 11/1988 | ........... G06F/11/16 |
|---|---|---|---|
| JP | 64-19401 | 1/1989 | |
| JP | 07271679 A | * 10/1995 | ........... G06F/12/16 |

* cited by examiner

*Primary Examiner*—Scott Baderman
(74) *Attorney, Agent, or Firm*—McDermott, Will & Emery (57) ABSTRACT

The present invention enables reliable shift to a fail-safe processing upon detection of failure by RAM diagnosis. To this end, the diagnosis result of the RAM diagnosis is doubly stored, as flags, into mutually different two addresses of the RAM; and a fail-safe processing is conducted based on the doubly stored diagnosis result flags when at least one of the flags indicates existence of failure. Otherwise, the diagnosis result of the RAM diagnosis is stored, as a flag, into a predetermined register; and a fail-safe processing is conducted based on the diagnosis result flag stored in the register such that the fail-safe processing is conducted when the flag indicates existence of failure.

10 Claims, 7 Drawing Sheets

DIAGNOSING APPARATUS AND METHOD FOR RAM

TECHNICAL FIELD OF THE INVENTION

The present invention relates to a diagnosing apparatus and method for RAM used in a control microcomputer for controlling a variety of electronic controlled devices such as in a vehicular engine.

BACKGROUND OF THE INVENTION

In a control apparatus for a vehicular engine, there has been conducted hitherto diagnosis such as of ROM and RAM by a CPU of a control microcomputer, in addition to self-diagnosis of the CPU (refer to Japanese Unexamined Patent Publication No. 64-19401).

In RAM diagnosis, there is conducted read-write check on a diagnosis object RAM by for example 4 bytes at each of predetermined diagnosis timing, and when a failure (NG) is detected, the diagnosis result is written, as a flag, into a predetermined address of the RAM itself.

Further, the flag indicating the diagnosis result is read out, and when the flag indicates existence of failure, there is conducted a fail-safe processing such as turning OFF of power source of the control object equipment.

However, in such a conventional RAM diagnosing apparatus, the diagnosis result is written, as a flag, into the RAM as a diagnosis object. As such, it has been a problem that the processing can be hardly shifted to the fail-safe processing even when a failure has been detected by the RAM diagnosis, if the flag itself for the diagnosis result fails.

In view of the conventional problem as described above, it is an object of the present invention to enable reliable shift to a fail-safe processing upon detection of failure by RAM diagnosis.

DISCLOSURE OF THE INVENTION

To this end, with the present invention, there is provided a diagnosing apparatus for a RAM comprising: a RAM diagnosing device for diagnosing a RAM used in a microcomputer; a diagnosis result storing device for doubly storing the diagnosis result of the RAM diagnosing device, as flags, into mutually different two addresses of the RAM; and a fail-safe processing device for conducting a fail-safe processing based on the doubly stored diagnosis result flags when at least one of the flags indicates existence of failure.

According to this constitution, the diagnosis result of the RAM diagnosis is doubly held and the processing is shifted to the fail-safe processing based on OR of the doubly held diagnosis result, thereby obtaining such an effect that the shift to the fail-safe processing is reliably conducted when a failure is detected by the RAM diagnosis.

In the above, the bit allocation of the doubly stored flags may be separately established, so as to cope with bit-line failure. To this end, the diagnosis result storing device may doubly store the diagnosis result into the mutually different two addresses and at mutually different bit positions of the RAM.

Further, to cope with failure in word lines, the address assignments of the doubly stored flags are offset from each other by a predetermined address interval. To this end, the diagnosis result storing device may doubly store the diagnosis result into two addresses of the RAM, which are different from each other and which have an address interval therebetween other than an address interval of word lines.

Moreover, with the present invention, there is provided a diagnosing apparatus for a RAM comprising: a RAM diagnosing device for diagnosing a RAM used in a microcomputer; a diagnosis result storing device for storing the diagnosis result of the RAM diagnosing device, as a flag, into a predetermined register; and a fail-safe processing device for conducting a fail-safe processing based on the diagnosis result flag stored in the register when the flag indicates existence of failure.

According to this constitution, the diagnosis result of the RAM diagnosis is stored in the register of the CPU side and the processing is shifted directly to the fail-safe processing from the register, thereby obtaining such an effect that the shift to the fail-safe processing is reliably conducted when a failure is detected by the RAM diagnosis.

In the above, the RAM diagnosing device may diagnose the RAM in a read-write manner.

Further, concretely, the fail-safe processing device may turn OFF power source of control object equipment of the microcomputer.

Characteristic features of the present invention and the resultant operation and effects will become apparent from the embodiments described hereunder.

BEST MODE FOR CARRYING OUT THE INVENTION

There will be described hereinafter the embodiments of the present invention, and particularly, those in case of diagnosing a RAM of a control microcomputer for a vehicular engine.

Figure 1:
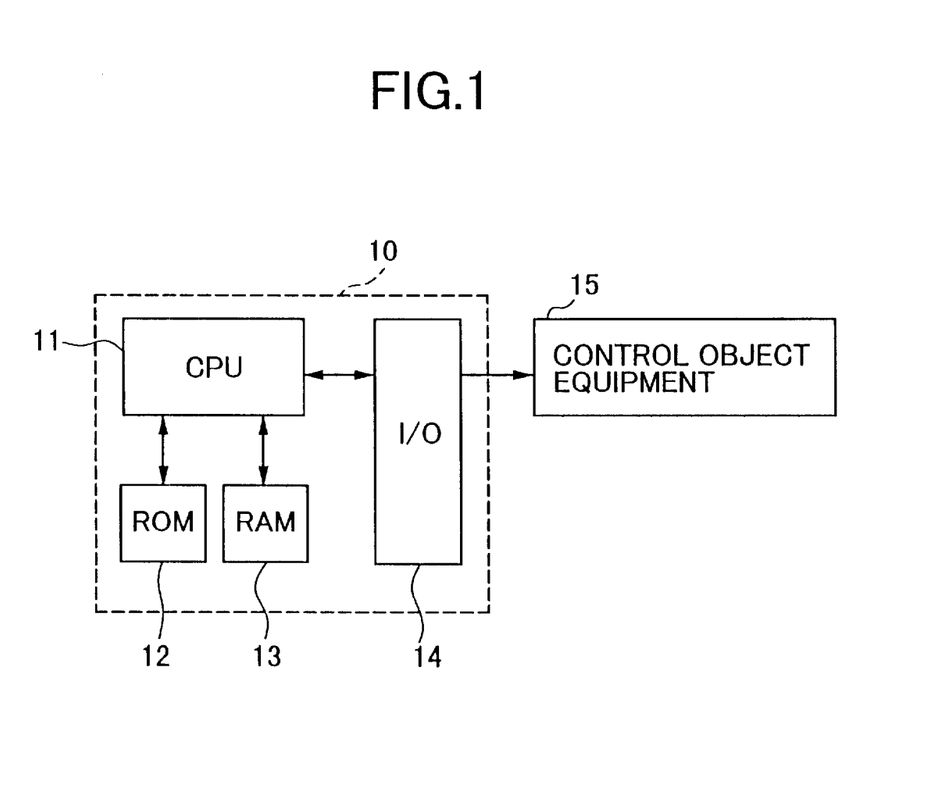
FIG. 1 is a constitutional view of a microcomputer showing an embodiment of the present invention.

FIG. 1 shows a constitutional view of a microcomputer 10, which comprises such as a CPU 11, ROM 12, RAM 13 and I/O interface 14, and controls the operation of control object equipment 15 such as an electronically controlled throttle valve of a vehicular engine.

Figure 2:
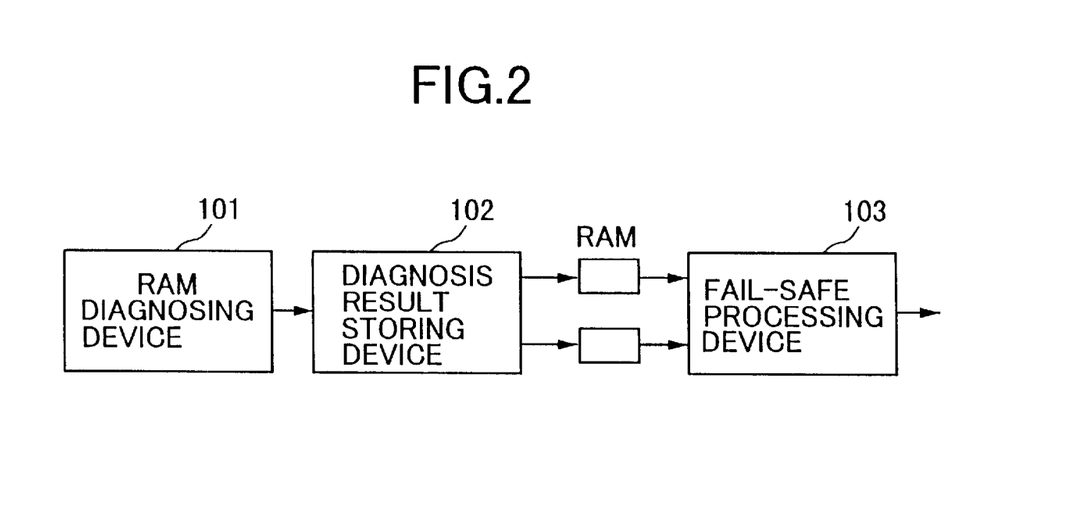
FIG. 2 is a basic constitutional view of a RAM diagnosing apparatus according to a first embodiment of the present invention.

FIG. 2 is a basic constitutional view of a RAM diagnosing apparatus of a first embodiment, which comprises a RAM diagnosing device 101 for diagnosing the RAM used in the microcomputer, a diagnosis result storing device 102 for doubly storing the diagnosis result, as flags, into mutually different two addresses of the RAM, and a fail-safe processing device 103 for conducting a fail-safe processing based on the doubly stored diagnosis result flags when at least one of the flags indicates existence of failure.

Figure 3:
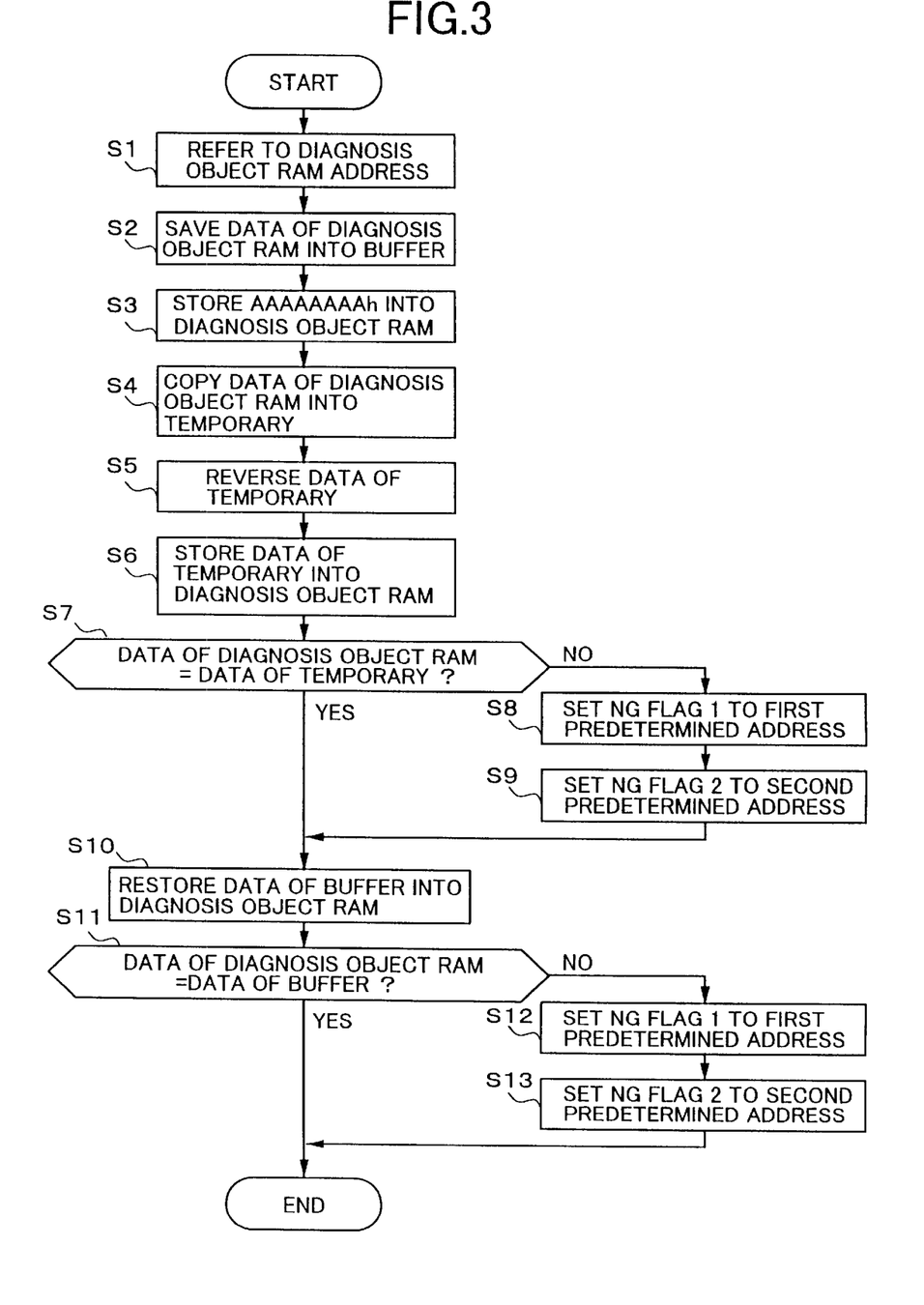
FIG. 3 is a flowchart of the RAM diagnosis of the first embodiment.

FIG. 3 is a flowchart of the RAM diagnosis to be executed by the CPU of the microcomputer in the first embodiment, and shows a content of diagnosis which is conducted on a diagnosis object RAM by for example 4 bytes at a time. This flow corresponds to the RAM diagnosing device.

At step 1 (depicted as S1 in the figure, and the same rule is applied hereinafter), a diagnosis object RAM address is referred to. It is noted that the diagnosis object RAM address is separately set such that the diagnosis is conducted, by each flow, on the diagnosis object RAM by 4 bytes, and the diagnosis is eventually conducted on all of the addresses of the RAM (after an initial setting, the address is incremented for each flow).

At step 2, the data of the diagnosis object RAM based on the diagnosis object RAM address is saved into a buffer.

At step 3, there is stored into the diagnosis object RAM, such as AAAAAAAAh (4-byte data).

At step 4, the data of the diagnosis object RAM is copied to a TEMPORARY (a temporary register of the CPU side).

At step 5, the data of the TEMPORARY is bit reversed. Thus, in case of AAAAAAAAh, there is obtained 55555555h.

At step 6, the data of the TEMPORARY is restored into the diagnosis object RAM again.

At step 7, the data of the diagnosis object RAM and the data of TEMPORARY are compared.

As a result of this comparison, if a difference is found, the result of the RAM diagnosis is determined as NG, and an NG flag 1 (=1) is set at a first predetermined address of the RAM at step 8, and an NG flag 2 (=1) is set at a second predetermined address of the RAM at step 9.

At step 10, the data of the buffer is restored into the diagnosis object RAM.

At step 11, the data of the diagnosis object RAM and the data of the buffer are compared.

As a result of this comparison, if a difference is found, the result of the RAM diagnosis is determined as NG, and the NG flag 1 (=1) is set at the first predetermined address of the RAM at step 12, and the NG flag 2 (=1) is set at the second predetermined address of the RAM at step 13.

In the above, the processes at steps 8, 9, 12 and 13 particularly correspond to the diagnosis result storing device.

Figure 4:
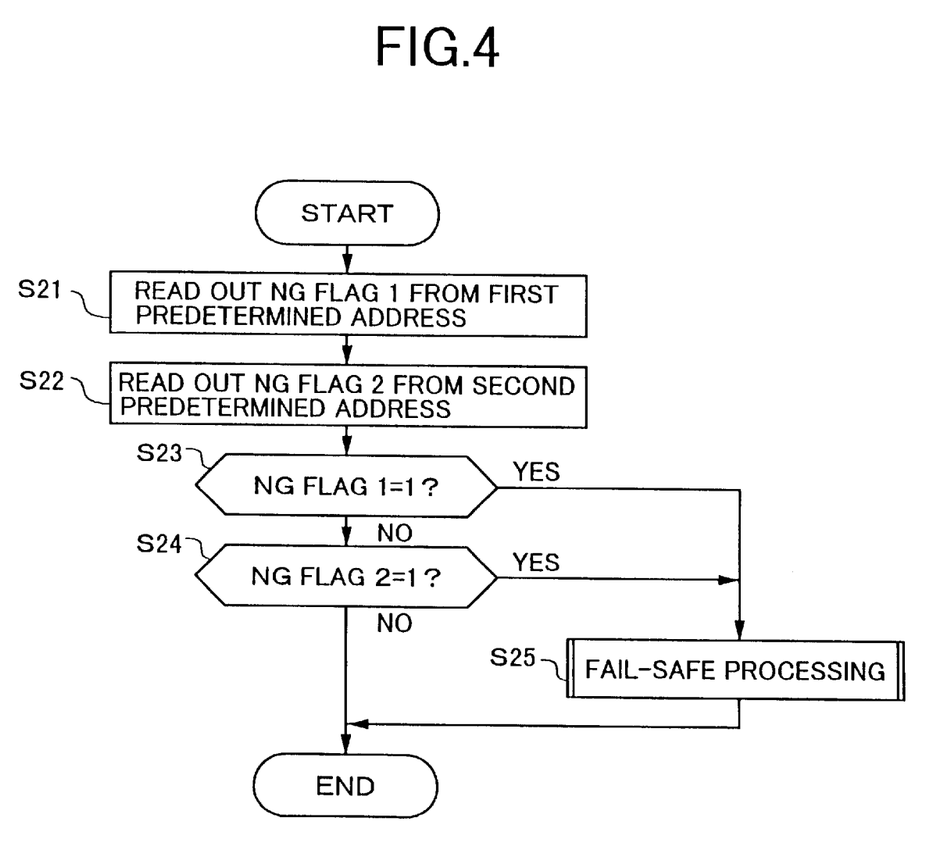
FIG. 4 is a flowchart of a fail-safe processing of the first embodiment.

FIG. 4 is a flowchart of a fail-safe processing to be executed by the CPU of the microcomputer in the first embodiment. This flow corresponds to the fail-safe processing device.

At step 21, the NG flag 1 is read out from the first predetermined address of the RAM.

At step 22, the NG flag 2 is read out from the second predetermined address of the RAM.

At step 23, it is judged whether NG flag 1=1 (existence of failure).

At step 24, it is judged whether NG flag 2=1 (existence of failure).

As a result of these judgments, when at least one of the NG flag 1 and NG flag 2 is 1 (indicative of failure), the flow goes to step 25 at which the fail-safe processing is conducted.

As the fail-safe processing, there is conducted such as turning OFF of power source of the control object equipment. For example, in case of controlling an electronically controlled throttle valve by a control apparatus of a vehicular engine, there is turned OFF a relay of a power source circuit to a motor of the electronically controlled throttle valve. By turning OFF the relay, the electronically controlled throttle valve is fixed at a fail-safe opening at a relatively small opening side, by means of action of a return spring. Thus, it is still allowed to effect minimum limp-home operating, though the engine output is restricted. It is otherwise possible to reset the microcomputer, as the fail-safe processing.

As described above, the diagnosis result of RAM is doubly written, as flags, into mutually different two addresses (the first and second predetermined addresses) of the RAM, and the flags of the doubly written diagnosis result are read out to thereby conduct the fail-safe processing when at least one of the flags indicates existence of failure. Thus, it becomes possible to reliably shift to a fail-safe processing upon detection of NG by the RAM diagnosis.

In the above, the bit allocation of the doubly stored flags is separately established, so as to cope with bit-line failure. Namely, the result of the RAM diagnosis is doubly written, as flags, into mutually different two addresses and at mutually different bit positions of the RAM.

Figure 5:
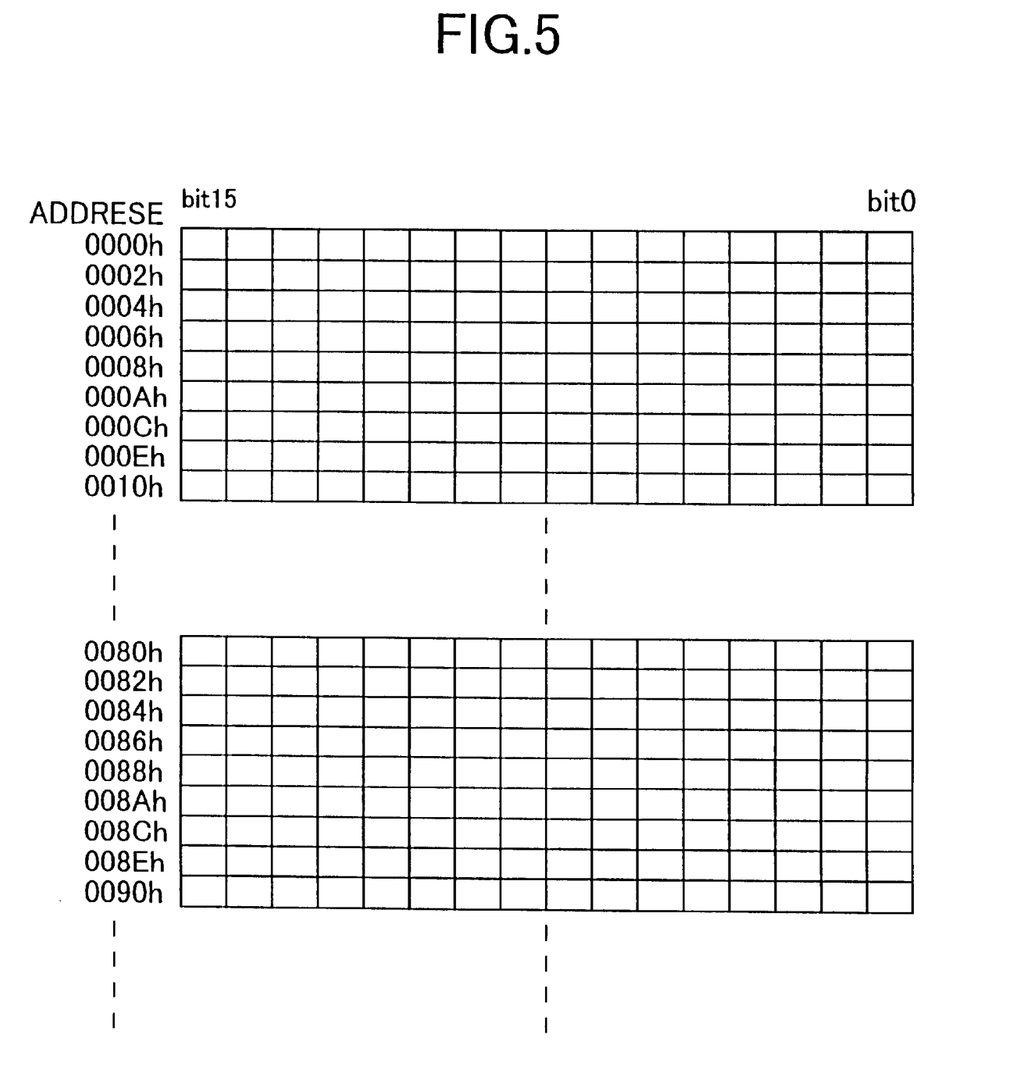
FIG. 5 is a view for explaining a setting position of NG flags of the first embodiment.

Concretely with reference to FIG. 5, assuming that the NG flag 1 (=1) is arranged such as at bit 0 of address 0000h, there is a great possibility of simultaneous failure of the flags in case of bit-line failure if the NG flag 2 (=1) is arranged at bit 0 even of another address. As such, the NG flag 2 (=1) is arranged at a different bit of another address, for example, at bit 7 in this case.

Further, to cope with failure in word lines, the address assignments of the doubly stored flags are offset from each other by a predetermined address interval. Namely, the diagnosis result of the RAM diagnosis is doubly written, as flags, into two addresses of the RAM, which are different from each other and which have an address interval therebetween other than an address interval of word lines (i.e., address interval at which identical failure occurs in case of word line failure).

Concretely with reference to FIG. 5, assuming that the NG flag 1 (=1) is arranged such as at address 0000h, there is a great possibility of simultaneous failure of the flags in case of failure of word line even if the NG flag 2 (=1) is arranged at another address, if the address interval of NG flag 2 (=1) is identical with an address interval (such as 80h, depending on a type of microcomputer) of word lines. As such, when the address interval of word lines is 80h, the NG flag 2 (=1) is arranged such as at address 0002h, or 0082h, so that the address interval of the NG flag 2 (=1) is not identical with the address interval of word lines.

There will be described hereinafter a second embodiment of the present invention.

Figure 6:
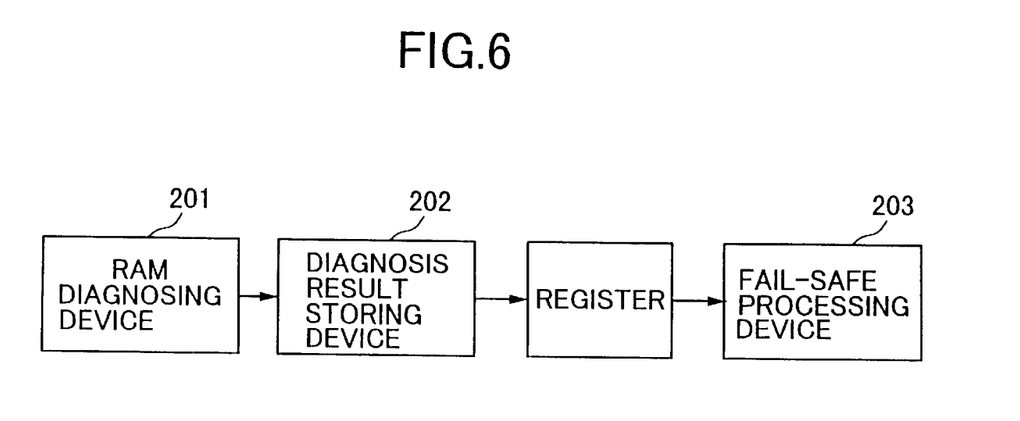
FIG. 6 is a basic constitutional view of a RAM diagnosing apparatus according to a second embodiment of the present invention.

FIG. 6 is a basic constitutional view of a RAM diagnosing apparatus of a second embodiment, which comprises a RAM diagnosing device 201 for diagnosing the RAM used in the microcomputer, a diagnosis result storing device 202 for storing the diagnosis result, as a flag, into a predetermined register, and a fail-safe processing device 203 for conducting a fail-safe processing based on the diagnosis result flag stored in the register when the flag indicates existence of failure.

Figure 7:
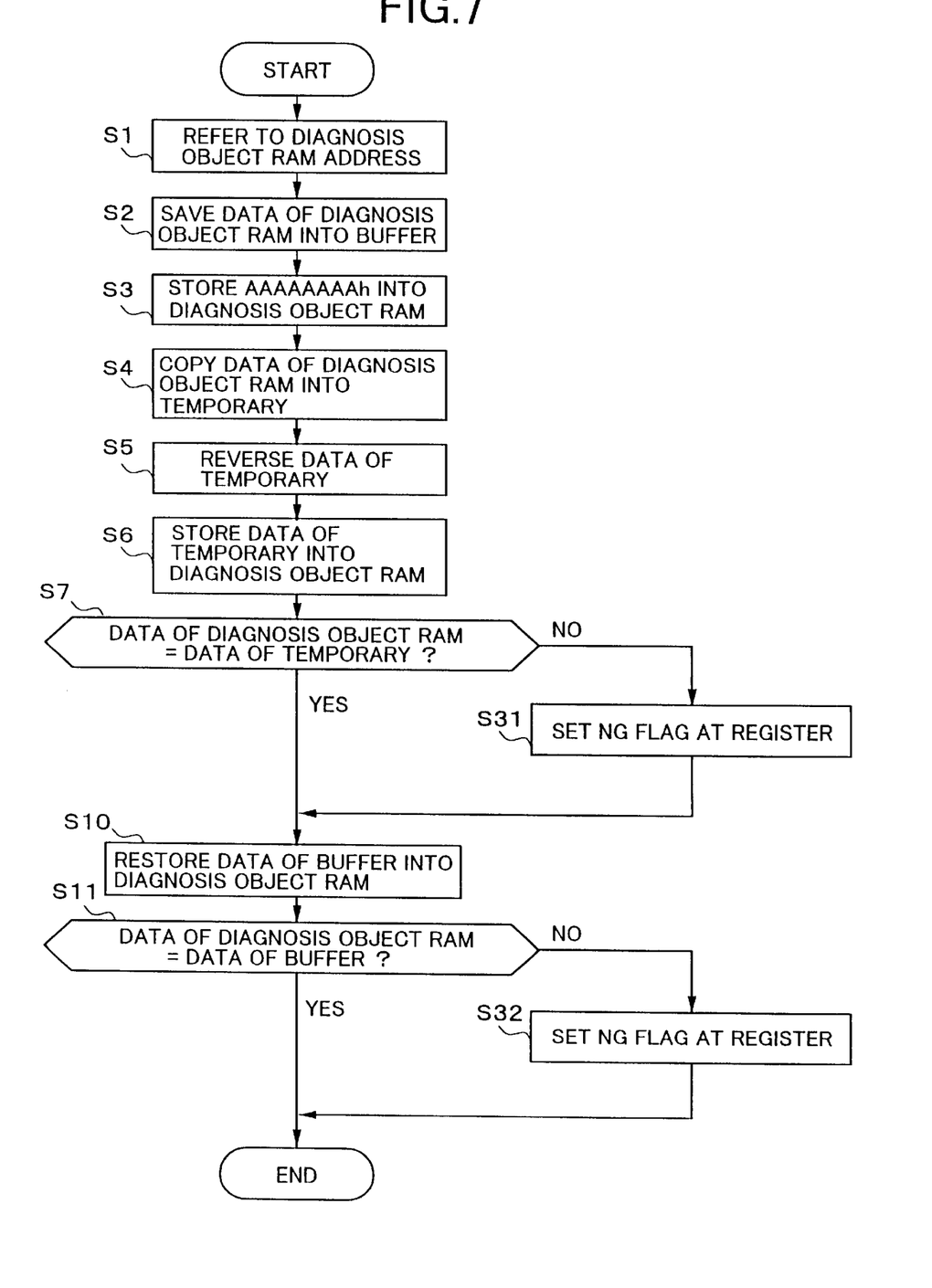
FIG. 7 is a flowchart of the RAM diagnosis of the second embodiment.

FIG. 7 is a flowchart of the RAM diagnosis to be executed by the CPU of the microcomputer in the second embodiment, and shows a content of diagnosis which is conducted on a diagnosis object RAM by 4 bytes at a time. This flow corresponds to the RAM diagnosing device.

The contents of steps 1 through 7 and 10 to 11 are identical with those in the first embodiment (FIG. 3), thus the explanation thereof shall be omitted.

At step 7, the data of the diagnosis object RAM and the data of TEMPORARY are compared. As a result of this comparison, if a difference is found, the result of the RAM diagnosis is determined as NG, and the diagnosis result NG (existence of failure) is stored into the predetermined register of the CPU side. Namely, an NG flag (=1) is set at the register.

At step 11, the data of the diagnosis object RAM and the data of the buffer are compared. As a result of this comparison, if a difference is found, the result of the RAM diagnosis is determined as NG, and the diagnosis result NG (existence of failure) is stored into the predetermined register of the CPU side. Namely, the NG flag (=1) is set at the register.

In the above, the processes at steps 31 and 32 particularly correspond to the diagnosis result storing device.

Figure 8:
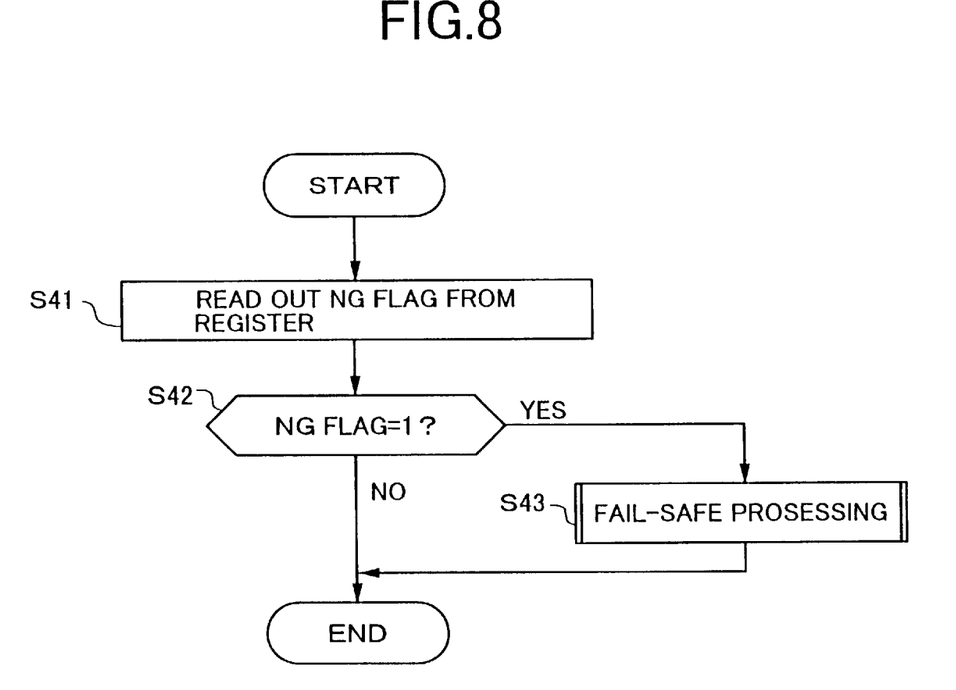
FIG. 8 is a flowchart of a fail-safe processing of the second embodiment.

FIG. 8 is a flowchart of a fail-safe processing to be executed by the CPU of the microcomputer in the second embodiment. This flow corresponds to the fail-safe processing device.

At step 41, the NG flag indicative of the diagnosis result is read out from the predetermined register.

At step 42, it is judged whether NG flag=1 (existence of failure) or not.

As a result of this judgment, when the NG flag=1 (indicative of failure), the flow goes to a step 43 at which the fail-safe processing is conducted.

As the fail-safe processing, there is conducted turning OFF of power source of the control object equipment, or resetting of microcomputer, similarly to the first embodiment.

As described above, the result of RAM diagnosis is stored, as a flag, into the register of the CPU side, and the processing is shifted directly to the fail-safe processing from the register. Thus, it becomes possible to reliably shift to a fail-safe processing upon detection of NG by the RAM diagnosis.

The method itself for conducting the RAM diagnosis is not limited to those shown in FIGS. 3 and 7. For example, there can be conducted read-write check, by omitting step 3. Namely, the diagnosis object RAM address is referred to (S1), the data of the diagnosis object RAM based on such address is saved into the buffer (S2), the data of the diagnosis object RAM is copied to the TEMPORARY (S4), the data of TEMPORARY is bit reversed (S5), the data of the TEMPORARY is stored into the diagnosis object RAM (S6), the data of the diagnosis object RAM and the data of the TEMPORARY (S7) are compared, and in case a difference is found, the result of the RAM diagnosis is determined as NG, and the NG flag 1 and NG flag 2 are set (S8, S9) or the NG flag is set at the register (S31). Further, the data of the buffer is restored into the diagnosis object RAM (S10), the data of the diagnosis object RAM and the data of the buffer (S11) are compared, and in case a difference is found, the result of the RAM diagnosis is determined as NG, and the NG flag 1 and NG flag 2 are set (S12, S13) or the NG flag is set at the register (S32).

As described above, according to the present invention, there is enabled reliable shift to a fail-safe processing upon detection of failure by the RAM diagnosis. Thus, reliability of RAM diagnosis is improved, and particularly in case that a RAM used in a control microcomputer for a vehicular engine is rendered to be a diagnosis object, such as reliability of engine control is improved, thereby increasing industrial applicability.

What we claimed are:

1. A diagnosing apparatus for a RAM, comprising:
    RAM diagnosing means for diagnosing a RAM used in a microcomputer;
    diagnosis result storing means for double storing the diagnosis result of said RAM diagnosing means, as flags, into mutually different two addresses of the RAM; and
    fail-safe processing means for conducting a fail-safe processing based on the double stored diagnosis result flags when at least one of the flags indicates existence of failure.

2. A diagnosing apparatus for a RAM of claim 1,
    wherein said diagnosis result storing means doubly stores the diagnosis result into the mutually different two addresses and at mutually different bit positions of the RAM.

3. A diagnosing apparatus for a RAM of claim 1,
    wherein said diagnosis result storing means doubly stores the diagnosis result into two addresses of the RAM, which are different from each other and which have an address interval therebetween other than an address interval of word lines.

4. A diagnosing apparatus for a RAM of claim 1,
    wherein said RAM diagnosing means diagnoses the RAM in a read-write manner.

5. A diagnosing apparatus for a RAM of claim 1,
    wherein said fail-safe processing means turns OFF power source of control object equipment of said microcomputer.

6. A method of diagnosing a RAM, comprising the steps of:
    diagnosing a RAM used in a microcomputer;
    doubly storing the diagnosis result of said step of diagnosing the RAM, as flags, into mutually different two addresses of the RAM; and
    conducting a fail-safe processing based on the doubly stored diagnosis result flags when at least one of the flags indicates existence of failure.

7. A method of diagnosing a RAM of claim 6,
    wherein said step of doubly storing the diagnosis result stores the diagnosis result into the mutually different two addresses and at mutually different bit positions of the RAM.

8. A method of diagnosing a RAM of claim 6,
    wherein said step of doubly storing the diagnosis result stores the diagnosis result into two addresses of the RAM, which are different from each other and which have an address interval therebetween other than an address interval of word lines.

9. A method of diagnosing a RAM of claim 6,
    wherein said step of diagnosing said RAM diagnoses the RAM in a read-write manner.

10. A method of diagnosing a RAM of claim 6,
    wherein said step of conducting the fail-safe processing turns OFF power source of control object equipment of said microcomputer.

* * * * *